United States Patent
Kavalieros et al.

(10) Patent No.: US 7,525,160 B2
(45) Date of Patent: Apr. 28, 2009

(54) MULTIGATE DEVICE WITH RECESSED STRAIN REGIONS

(75) Inventors: Jack T. Kavalieros, Portland, OR (US);
Justin K. Brask, Portland, OR (US);
Suman Datta, Beaverton, OR (US);
Brian S. Doyle, Portland, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/320,309

(22) Filed: Dec. 27, 2005

(65) Prior Publication Data
US 2007/0145487 A1 Jun. 28, 2007

(51) Int. Cl.
- H01L 29/76 (2006.01)
- H01L 29/94 (2006.01)
- H01L 31/062 (2006.01)
- H01L 31/113 (2006.01)
- H01L 31/119 (2006.01)

(52) U.S. Cl. ............... 257/369; 257/382; 257/E27.06; 257/E27.062

(58) Field of Classification Search ............... 257/55, 257/57, 338, 368–369, 374, 382, E27.06
See application file for complete search history.

(56) References Cited

U.S. PATENT DOCUMENTS

| | | | |
|---|---|---|---|
| 5,804,848 A | 9/1998 | Mukai | |
| 5,844,278 A | 12/1998 | Mizuno et al. | |
| 5,899,710 A | 5/1999 | Mukai | |
| 6,018,176 A | 1/2000 | Lim | |
| 6,046,494 A | 4/2000 | Brigham et al. | |
| 6,066,869 A | 5/2000 | Noble et al. | |
| 6,362,082 B1 | 3/2002 | Doyle et al. | |
| 6,413,802 B1 | 7/2002 | Hu et al. | |
| 6,459,123 B1 | 10/2002 | Enders et al. | |
| 6,472,258 B1 | 10/2002 | Adkisson et al. | |
| 6,525,403 B2 | 2/2003 | Inaba et al. | |
| 6,562,665 B1 | 5/2003 | Yu | |
| 6,563,152 B2 | 5/2003 | Roberds et al. | |
| 6,583,469 B1 | 6/2003 | Fried et al. | |
| 6,611,029 B1 | 8/2003 | Ahmed et al. | |
| 6,621,131 B2 | 9/2003 | Murthy et al. | |
| 6,630,388 B2 | 10/2003 | Sekigawa et al. | |
| 6,635,909 B2 | 10/2003 | Clark et al. | |
| 6,642,090 B1 | 11/2003 | Fried et al. | |

(Continued)

FOREIGN PATENT DOCUMENTS

WO    WO 2005/112577 A2    12/2005

(Continued)

OTHER PUBLICATIONS

Yang-Kyu Choi et at., "Sub-20nm CMOS FinFET Technologies", 2001 IEEE, IEDM 01-421, pp. 19.1.1-19.1.4.

(Continued)

*Primary Examiner*—Hoai v Pham
(74) *Attorney, Agent, or Firm*—Rahul Engineer

(57) ABSTRACT

Embodiments of the invention provide a device with a multiple gates. Stress material within recesses of a device body metal gate may cause a stress in channel regions of the device, thereby improving performance of the device.

14 Claims, 10 Drawing Sheets

U.S. PATENT DOCUMENTS

| | | |
|---|---|---|
| 6,657,259 B2 | 12/2003 | Fried et al. |
| 6,689,650 B2 | 2/2004 | Gambino et al. |
| 6,770,516 B2 | 8/2004 | Wu et al. |
| 6,787,402 B1 | 9/2004 | Yu |
| 6,794,718 B2 | 9/2004 | Nowak et al. |
| 6,798,000 B2 | 9/2004 | Luyken et al. |
| 6,800,910 B2 | 10/2004 | Lin et al. |
| 6,803,631 B2 | 10/2004 | Dakshina-Murthy et al. |
| 6,812,075 B2 | 11/2004 | Fried et al. |
| 6,815,277 B2 | 11/2004 | Fried et al. |
| 6,821,834 B2 | 11/2004 | Ando |
| 6,833,588 B2 | 12/2004 | Yu et al. |
| 6,835,614 B2 | 12/2004 | Hanafi et al. |
| 6,849,884 B2 | 2/2005 | Clark et al. |
| 6,858,478 B2 | 2/2005 | Chau et al. |
| 6,869,868 B2 | 3/2005 | Chiu et al. |
| 6,885,055 B2 | 4/2005 | Lee |
| 6,897,527 B2 | 5/2005 | Dakshina-Murthy et al. |
| 6,909,151 B2 | 6/2005 | Hareland et al. |
| 6,946,350 B2 | 9/2005 | Lindert et al. |
| 6,974,733 B2 | 12/2005 | Boyanov et al. |
| 2003/0085424 A1 | 5/2003 | Bryant et al. |
| 2004/0036126 A1 | 2/2004 | Chau et al. |
| 2004/0108559 A1 | 6/2004 | Sugii et al. |
| 2004/0173812 A1 | 9/2004 | Currie et al. |
| 2004/0191980 A1 | 9/2004 | Rios et al. |
| 2005/0035409 A1 | 2/2005 | Ko et al. |
| 2005/0087801 A1 | 4/2005 | Lindert et al. |
| 2005/0136584 A1 | 6/2005 | Boyanov et al. |
| 2005/0145894 A1 | 7/2005 | Chau et al. |
| 2005/0148137 A1 | 7/2005 | Brask et al. |
| 2005/0158970 A1 | 7/2005 | Chau et al. |
| 2005/0179066 A1 | 8/2005 | Murthy et al. |
| 2005/0184345 A1 | 8/2005 | Lin et al. |
| 2005/0202618 A1 | 9/2005 | Yagishita |
| 2005/0211982 A1 | 9/2005 | Lei et al. |
| 2005/0285203 A1* | 12/2005 | Fukutome et al. ............ 257/368 |

FOREIGN PATENT DOCUMENTS

WO    WO 2006/026339 A2    3/2006

OTHER PUBLICATIONS

Jong-Tae Park, et al., "PiGate SOI MOSFET", 2001 IEEE, IEEE Elctron Device Letters, vol. 22, No. 8, Aug. 2001, pp. 405-406.

Scott A. Hareland et al., U.S. Appl. No. 10/607,769, entitled "Nonplanar Semiconductor Device with Partially or Fully Wrapped Around Gate Electrode and Methods of Fabrication," filed Jun. 27, 2003.

Brian S. Doyle et al., U.S. Appl. No. 11/039,197, entitled "Non-Planar MOS Structure with a Strained Channel Region," filed Jan. 18, 2005.

Mohamad A. Shaheen et al., U.S. Appl. No. 10/883,183, entitled "High Mobility Tri-Gate Devices and Methods of Fabrication," filed Jun. 30, 2004.

Brian Doyle et al., U.S. Appl. No. 10/915,780, entitled "Non-Planar pMOS Structure with a Strained Channel Region and an Integrated Stained CMOS Flow," filed Aug. 10, 2004.

Brian Doyle et al., U.S. Appl. No. 10/949,994, entitled "U-Gate Transistors and Methods of Fabrication," filed Sep. 23, 2004.

Nick Lindert et al., U.S. Appl. No. 10/955,669, entitled "Metal Gate Transistors with Epitaxial Source and Drain Regions," filed Sep. 29, 2004.

Jack Kavalieros et al., U.S. Appl. No. 11/110,485, entitled "Compensating for Induced Strain in the Channels of Metal Gate Transistors," filed Apr. 20, 2005.

Suman Datta et al., U.S. Appl. No. 10/953,295, entitled "Inducing Strain in the Channels of Metal Gate Transistors," filed Sep. 29, 2004.

Jack Kavalieros et al., U.S. Appl. No. 11/078,267, entitled "Complimentary Metal Oxide Semiconductor Integrated Circuit Using Uniaxial Compressive Stress and Biaxial Compressive Stress," filed Mar. 11, 2005.

Marko Radosavljevic et al., U.S. Appl. No. 11/240,440, entitled "Fabrication of Channel Wraparound Gate Structure for Field-Effect Transistor," filed Sep. 29, 2005.

Been-Yih Jin et al., U.S. Appl. No. 11/167,647, entitled "Strained Field Effect Transistors," filed Jun. 27, 2005.

Verheyen P., et al., "25% Drive Current Improvement for P-type Multiple Gate Fet (mugfet) Devices By The Introduction of Recessed Si0.8ge0.2 In The Source And Drain Regions", Vlsi Technology, 2005. Digest of Technical Papers. 2005 Symposium on Kyoto, Japan, Jun. 14-26, 2005, Piscataway, NJ, USA, IEEE Jun. 14, 2005, pp. 194-195.

* cited by examiner

MULTIGATE DEVICE WITH RECESSED STRAIN REGIONS

BACKGROUND

Background of the Invention

Increased performance of circuit devices on a substrate (e.g., integrated circuit (IC) transistors, resistors, capacitors, etc. on a semiconductor substrate) is typically a major factor considered during design, manufacture, and operation of those devices. For example, during design and manufacture or forming of metal oxide semiconductor (MOS) transistor semiconductor devices, such as those used in a complementary metal oxide semiconductor (CMOS), it is often desired to increase mobility of negatively charged electrons in N-type MOS device (NMOS) channels and to increase movement of positive charged holes in P-type MOS device (PMOS) channels.

DETAILED DESCRIPTION

Figure 1A:
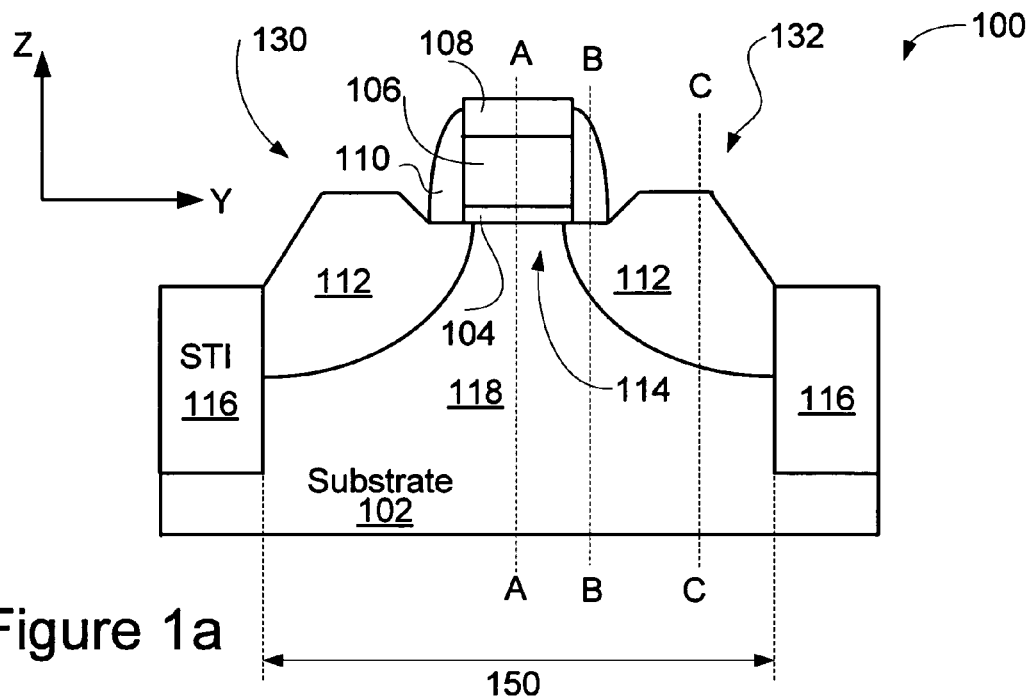
FIGS. 1a through 1e are cross sectional side views that illustrate the semiconductor device of one embodiment of the present invention.

In various embodiments, an apparatus and method relating to the formation of a strained multi-gate device are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

A non-planar multi-gate (such as tri-gate) transistor with a stressed channel and its method of fabrication is disclosed herein. The transistor may include a stress material in recesses of a semiconductor body to provide a stress to the channel region to improve carrier mobility. Greater carrier mobility may result in increased transistor drive current. In an embodiment of the present invention, the stress material may be formed in recesses on all sides of a semiconductor body adjacent to the channel region. This may result in stress on all sides of the channel, thereby providing stress over a large area and improving device performance. The semiconductor body may be formed from a semiconductor substrate that is not a semiconductor-on-insulator (SOI) substrate.

FIG. 1a is a cross sectional side view that illustrates the semiconductor device 100 of one embodiment of the present invention. The cross-sectional side view of FIG. 1a is taken through a plane defined as the Z-Y plane. Other Figures may be cross-sectional side views through a Z-X plane, defined as perpendicular to the Z-Y plane. Still other Figures may be perspective views that show all three dimensions, X, Y, and Z. As used herein, the "length" of the device 100 is measured in the Y direction, the width in the X direction, and the height in the Z direction.

The device 100 may be a multi-gate transistor formed on a substrate 102 in some embodiments. In the embodiment illustrated herein, the device 100 is illustrated as a tri-gate transistor, although the device 100 may be other types of transistors or other devices in other embodiments. Substrate 102 may comprise any material that may serve as a foundation upon which a semiconductor device may be built. The substrate 102 may be a silicon containing substrate 102. In an embodiment, the substrate 102 may comprise a semiconductor material such as single crystal silicon, gallium arsenide or another suitable material. In some embodiments, the substrate 102 may be a bulk semiconductor substrate 102 and not an SOI substrate. In other words, the substrate 102 may lack the buried oxide layer found in SOI substrates. In an embodiment, the substrate 102 may comprise a semiconductor material having a crystal lattice with a lattice structure and a lattice spacing.

The device 100 may include a body 118 (also referred to as a "fin" in some embodiments). The body 118 may be a region of the substrate 102, as illustrated in the embodiment of FIG. 1. In other embodiments, the body 118 may be a different layer than the substrate 102. In an embodiment, the body 118 may have a top surface and side walls and protrude above some other portions of the device 100 so as to take a fin shape. In an embodiment, the body 118 may comprise a semiconductor material having a crystal lattice with a lattice structure and a lattice spacing. Because the body 118 may simply be a region of the substrate 102, the body 118 may have the same crystal structure with the same lattice structure and lattice spacing as the body 102. The body 118 may have a fin shape, and may have a length 150.

There may be a gate dielectric layer 104 on the body 108. Gate dielectric layer 104 may comprise any suitable type of dielectric material. In an embodiment of the present invention, the gate dielectric layer 104 may be a silicon dioxide ($SiO_2$), silicon oxynitride ($SiO_xN_y$) or a silicon nitride ($Si_3N_4$) dielectric layer 104. In another embodiment of the present invention, the gate dielectric layer 104 may be a high-K gate dielectric layer, such as a metal oxide dielectric, and comprise a material such as but not limited to tantalum pentaoxide ($Ta_2O_5$), $HfO_2$, $ZrO_2$ and titanium oxide ($TiO_2$).

There may be a gate electrode 106 on the gate dielectric layer 104. The gate electrode 106 may be formed of any suitable gate electrode material. In an embodiment, the gate electrode 106 may comprise polysilicon, which may be doped. The gate electrode 106 may be a metal gate electrode in other embodiments, and comprise a material such as tungsten, tantalum, titanium or their nitrides, a metal alloy or another material. There may be a channel region 114 of the body 118 beneath the gate electrode 106.

There may be a hard mask layer 108 on the gate electrode 106. The hard mask layer 108 may comprise any material suitable for use when patterning the gate electrode 108.

There may be spacers 110 adjacent the gate dielectric layer 104, gate electrode 106, and hard mask layer 108. The spacers 110 may comprise any suitable material, such as silicon nitride, aluminum nitride, or another material. In some embodiments, the top of the spacers 110 may not be as high as the top of the hard mask layer 108.

There may be source and drain material 112 in recesses in the body 118 on either side of the gate electrode 106. The source and drain material 112 may have a lattice structure substantially the same as the lattice structure of the body 118 and a lattice spacing different than the lattice spacing of the body. The source and drain material 112 may thereby cause a strain in the channel region 114 and increase the performance of the device 100. For example, source and drain material 112 may have a larger lattice spacing than the material of the body 118, resulting in a compressive stress in the channel region 114. This compressive stress may improve the performance by increasing movement of positive charged holes in P-type MOS device (PMOS) channels. In another embodiment, the source and drain material 112 may have a smaller lattice spacing than the material of the body 118, resulting in a tensile stress in the channel region 114. This tensile stress may improve the performance by increasing movement of negatively charged electrons in N-type MOS device (NMOS) channels. Source and drain material 112 may comprise: silicon germanium (SiGe), silicon carbide (SiC), nickel silicide (NiSi), titanium silicide ($TiSi_2$), cobalt silicide ($CoSi_2$), or another suitable material that causes the channel regions 114 to be stressed. In embodiments where the device 100 includes a source 130 and drain 132, the source and drain material 112 may comprise all or part of the source 130 and drain 132.

There may also be front and back shallow trench isolation (STI) regions 116 that isolate the device 100 from other devices on the same substrate 102. The STI regions 116 may comprise any suitable material.

Figure 1B:
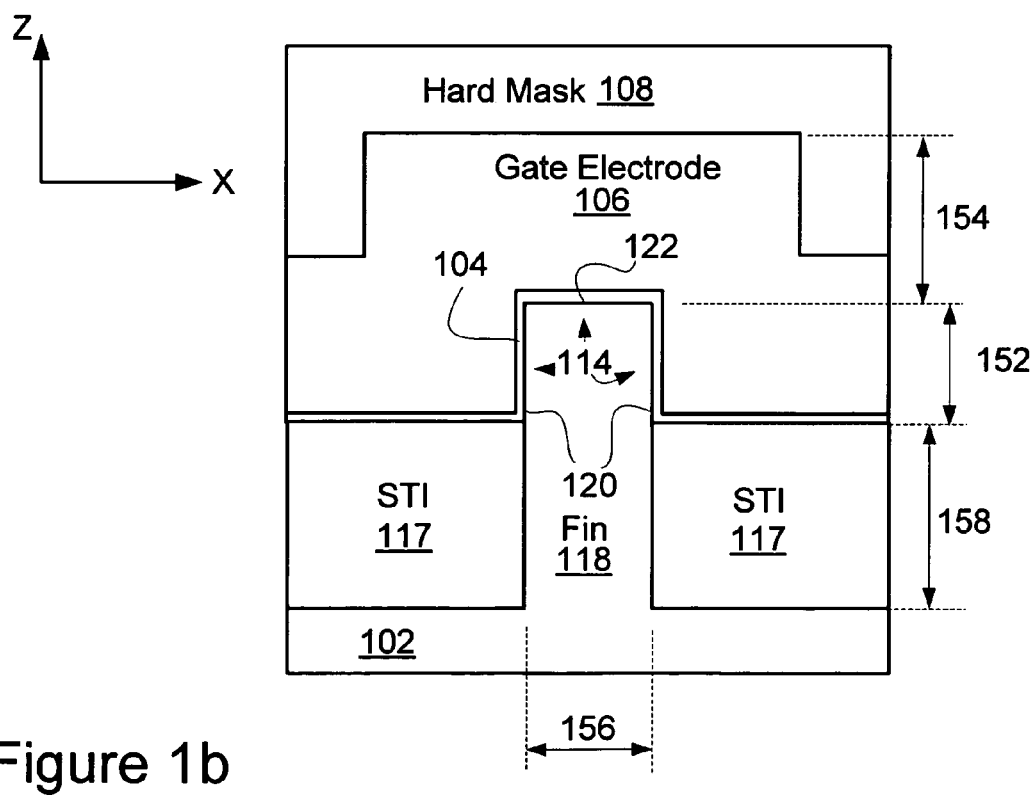

FIG. 1b is a cross sectional side view through line A-A of FIG. 1a that illustrates the semiconductor device 100 of one embodiment of the present invention. The cross-sectional side view of FIG. 1b is taken through a plane defined as the Z-X plane perpendicular to the Z-Y plane shown in FIG. 1a. FIG. 1b illustrates the multi-gate aspect of the device 100 more clearly.

The device 100 may include side STI regions 117 that isolate the device 100 from other devices on the same substrate 102. The STI regions 117 may comprise any suitable material.

The three-dimensional multi-gate nature of the device 100 can be seen more clearly in FIG. 1b. The dielectric layer 104 may be adjacent to the top surface 122 and the side walls 120 of the body 118. Similarly, the gate electrode 106 may be adjacent all three sides of the body 118 in the embodiment illustrated in FIG. 1b. This may result in three channel regions 114, on the top and the sides, rather than just a single channel region 114. The channel regions 114, including channel regions 114 at the side walls 120 of the body 118, are referred to herein as being "under" the gate electrode 106. While the gate electrode 106 is horizontally adjacent the channel regions 114 at the side walls 120 of the body 118, they are nonetheless considered "under" the gate electrode 106 and described and claimed as such. Such a device 100 with the gate electrode 106 on three sides of the body 118, resulting in three channel regions 114, may be referred to as a tri-gate device 100. The gate electrode 106 may also be somewhat conformal to the body 118 and adjacent STI regions 117, with the hard mask layer 108 conformal to the gate electrode 106, as illustrated in FIG. 1b.

The body 118 may have a height 152, measured from the top of the STI region 117 to the top of the body 118, beneath a central portion of the gate electrode 106. The body 118 may also have a width 156, measured at a non-recessed portion of the body 118 (i.e. measured at the portion of the body 118 through which line A-A passes, and not measured at the top of the portions of the body 118 through which lines B-B or C-C pass, as the body 118 is recessed in those portions). The gate electrode 106 may have a height 154, measured from the top of the body 118 to the top of the gate electrode 106. The STI regions 117 may have a depth 158, measured from the top of the STI region 117 to its lower boundary. The depth of STI regions 116 may be substantially the same as the depth 158 of STI regions 117.

In an embodiment, the depth 158 of the STI regions may be about twice the height 152 of the body 118. In another embodiment, the depth 158 of the STI regions may be greater than or about equal to twice the height 152 of the body 118. In another embodiment, the depth 158 of the STI regions may be between about 1.8 times the height 152 of the body 118 and about 2.2 times the height 152 of the body 118.

The height 154 of the gate electrode 106 may be about twice the height 152 of the body 118 in an embodiment. The height 154 of the gate electrode 106 may be greater than about twice the height 152 of the body 118 in an embodiment. The height 154 of the gate electrode 106 may be greater than about two-thirds the height 152 of the body 118 in an embodiment. In yet another embodiment, the height 154 of the gate electrode 106 may be between about 1.8 times the height 152 of the body 118 and about 2.2 times the height 152 of the body 118. In yet another embodiment, the height 154 of the gate electrode 106 may be between about 1.5 times the height 152 of the body 118 and about 2 times the height 152 of the body 118. In yet another embodiment, the height 154 of the gate electrode 106 may be between about 1.5 times the height 152 of the body 118 and about equal to the height 152 of the body 118. In other embodiments, the height 154 of the gate electrode 106 may be less or greater.

The height 152 of the body 118 may be about twice the width 156 of the body 118 in an embodiment. In another embodiment, the height 152 of the body 118 may be greater than twice the width 156 of the body 118. In another embodiment, the height 152 of the body 118 may be between about 1.8 times the width 156 of the body 118 and about 2.2 times the width 156 of the body 118. Other sizes of the height 152 of the body 118 and the width 156 of the body 118 may be used in other embodiments. In some embodiments, the width 156 of the body 118 may be chosen to allow the channel regions 114 to be substantially fully depleted during operation. Thus, in some embodiments, if the substrate 102 is highly doped, the width 156 may be smaller to result in substantially full depletion.

In an embodiment, the body 118 may have a width 156 of about 20 nanometers and a height 152 of about 40 nanometers, with the height 154 of the gate electrode 106 being at least 40 nanometers and the depth 158 of the STI regions 116, 117 being at least 40 nanometers. In an embodiment, the depth 158 of the STI regions 116, 117 may be between about two times the height 152 of the body 118 and about three times the height 152 of the body 118, although in other embodiments, the STI regions 116, 117 may have different depths. In another embodiment, the gate electrode 106 height 154 may be about 30 nanometers and the body 118 width 156 between about 20 nanometers and about 40 nanometers. In some embodiments, the body 118 height 152 may be between about 20 nanometers and about 100 nanometers. In some embodiments, the body 118 width 156 may be between about 10 nanometers and about 50 nanometers. In yet other embodiments, the structures of the device 100 may have different sizes.

Figure 1C:
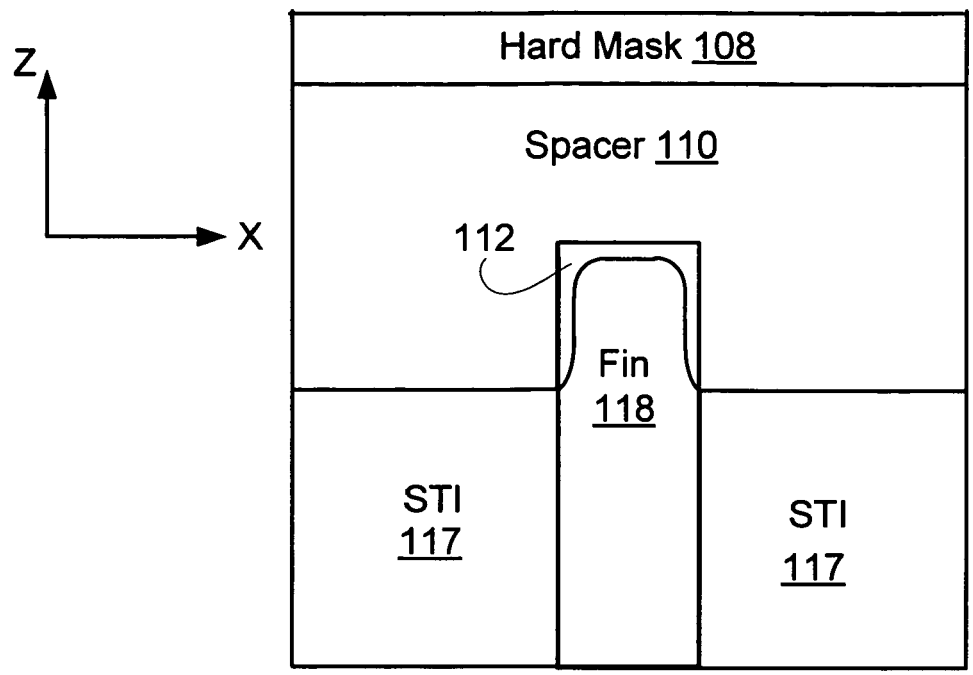

FIG. 1c is a cross sectional side view through line B-B of FIG. 1a that illustrates the semiconductor device 100 of one embodiment of the present invention. As seen in FIG. 1c, the fin 118 has been recessed etched on all three sides (top surface and two side walls), and the etching has undercut under the spacer 110. The source and drain material 112 is present on all three sides of the fin 118 and therefore may apply a stress to all three sides of the fin 118. (Note that in FIG. 1c, the hard mask 108 is visible behind the spacer 110, but the cross section through line B-B does not cut through hard mask 108.)

Figure 1D:
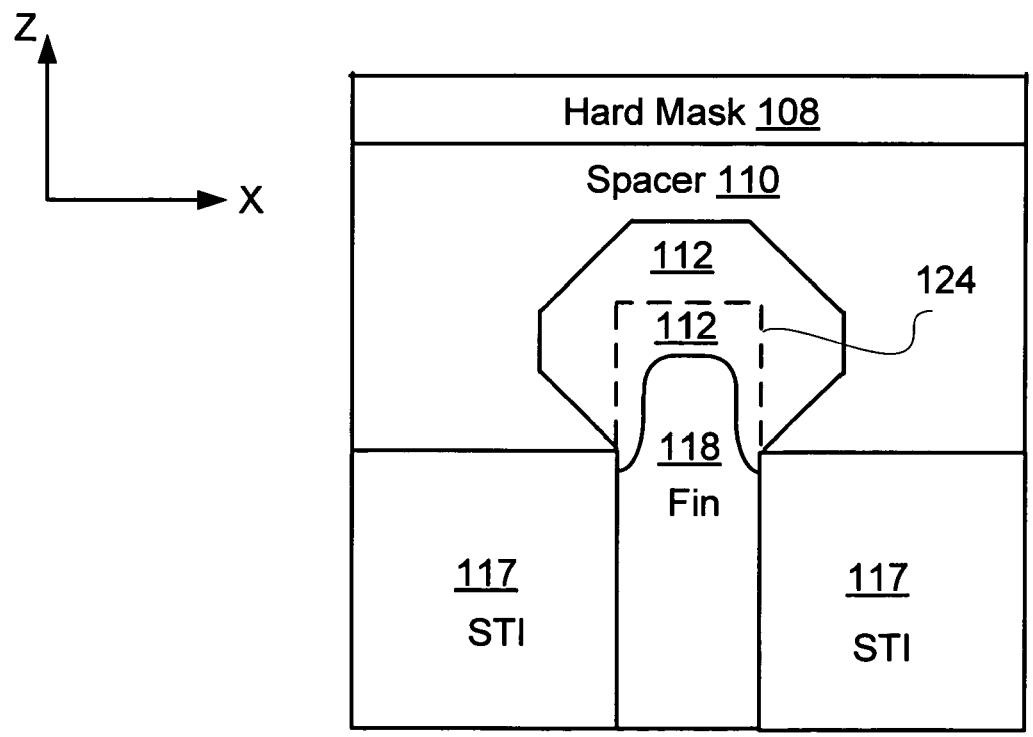

FIG. 1d is a cross sectional side view through line C-C of FIG. 1a that illustrates the semiconductor device 100 of one embodiment of the present invention. As can be seen in FIG. 1d, more of the fin 118 has been etched away further from the spacer 110, as opposed to FIG. 1c, which shows less of the fin 118 being etched away under the spacer 110. Dashed line 124 represents the original boundary of the fin 118 prior to it being etched away to form recesses in the body 118. In the embodiment shown in FIG. 1d, source and drain material 112 has been formed in the recesses in fin 118 and also extends beyond the former boundary 124 of the fin 118. Again, in an embodiment, there may be recesses on all three sides of the fin 118 and source and drain material 112 on all three sides 118, which may apply a stress to all three channel regions 114. (Note that in FIG. 1d, the hard mask 108 and spacer 110 are visible behind the source and drain material 112, but the cross section through line C-C does not cut through hard mask 108 or spacer 110.) In some embodiments where the height 154 of the gate electrode 106 is less than the height 152 of the body 118, formation of the spacers 110 that isolate the gate electrode 106 from the source/drain regions 130/132 may limit the recesses in the sides of the fin 118. In such embodiments, most of the source/drain material 112 may be at the top portion of the body 118.

Figure 1E:
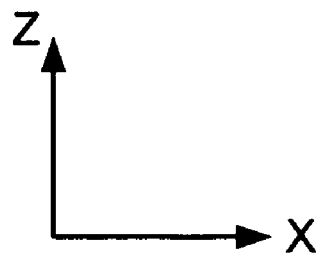
Figure 1E:
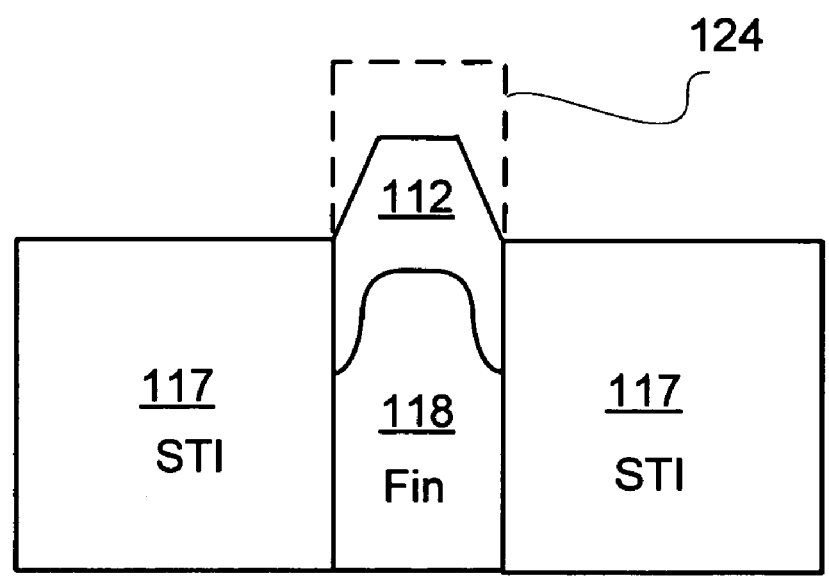

FIG. 1e is a cross sectional side view through line C-C of FIG. 1a that illustrates the semiconductor device 100 of another embodiment of the present invention. In the embodiment of FIG. 1e more of the fin 118 was etched away than in the embodiment of FIG. 1d, resulting in deeper recesses. The source and drain material 112 has grown in the recess, but does not extend beyond the original boundary of the fin 118 in this embodiment. (Note that in other embodiments, the source and drain material 112 may be beyond the limit illustrated in FIG. 1e.) The source and drain material 112 on all three sides 118 may apply a stress to all three channel regions 114. (Note that in FIG. 1e, the hard mask 108 and spacer 110 behind the source and drain material 112 have been omitted.)

FIGS. 2 through 12 illustrate stages in the formation of the device 100 of FIG. 1, according to one embodiment.

Figure 2:
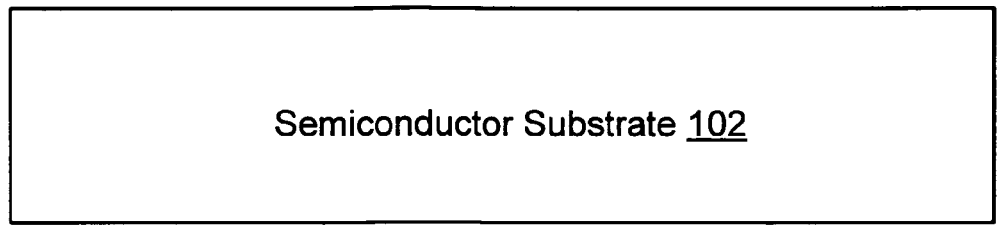
FIG. 2 is a cross sectional side view that illustrates a substrate from which the device may be formed.

FIG. 2 is a cross sectional side view that illustrates a substrate 102 from which the device 100 may be formed according to one embodiment. The substrate 102 may comprise any suitable material from which devices 100 may be formed. In an embodiment, the substrate 102 may be a bulk single crystal silicon material (i.e. not an SOI substrate, and therefore without a buried oxide layer). In such an embodiment, recesses for source and drain material 112 may be formed as deeply as is desired, rather than being limited by the depth at which a buried oxide layer is located. This may enable deeper recesses and greater stresses being applied to the channel regions 114, which may improve performance. In other embodiments, other semiconductor materials, such as gallium arsenide, or other materials, may be used.

Figure 3:
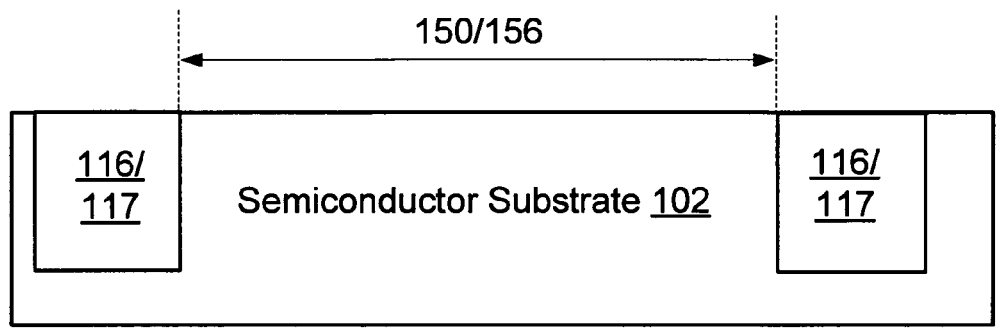
FIG. 3 is a cross sectional side view that illustrates the substrate after STI regions have been formed therein.

FIG. 3 is a cross sectional side view that illustrates the substrate 102 after STI regions 116, 117 have been formed therein. In an embodiment, portions of the substrate 102 may be protected, the unprotected portions may be removed to form trenches, and material suitable for STI use may be deposited within the trenches. Both the front and back STI regions 116 and the side STI regions 117 may be formed at the same time in some embodiments. The distance between the trenches in which the front and back STI regions 116 are formed may define the length 150 of the fin 118, and the distance between the trenches in which the side STI regions 117 are formed may define the width 156 of the fin 118. The depth of the STI regions 116, 117 may be chosen based on the desired height 152 of the body 118 and desired STI depth 158.

Figure 4:
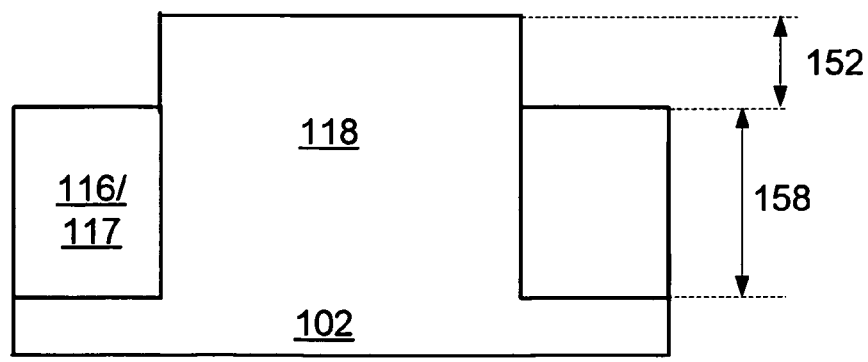
FIG. 4 is a cross sectional side view that illustrates the device after portions of the STI regions have been removed to form the fin.

FIG. 4 is a cross sectional side view that illustrates the device 100 after portions of the STI regions 116, 117 have been removed to form the fin 118, according to one embodiment. In an embodiment, portions of the STI regions 116, 117 may be removed with hydrofluoric acid. In other embodiments, other methods such as RIE dry etching may be used. The amount of original STI regions 116, 117 removed may determines the height 152 of the body 118 in some embodiments. Thus, the amount of originally-present STI regions 116, 117 removed may be decided based on the desired height 152 of the body 118. The remaining amount of STI regions 116, 117 determines the depth 158 of the STI regions 116, 117. Thus, after removal of part of the STI regions 116, 117, the body or fin 118 that extends above the rest of the substrate 102 and the STI regions 116, 117 has been defined.

As stated above with respect to FIG. 3, the original depth of the STI regions 116, 117 illustrated in FIG. 3 may be chosen based on the desired height 152 of the body 118 and desired STI region 116, 117 depth 158. Because the original depth of the STI regions 116, 117 include both the height 152 of the body and the depth 158 of the STI regions 116, 117 after formation of the fin 118, the original depth of the STI regions 116, 117 is chosen to be at least equal to the combined height 152 of the body 118 and depth of the STI regions 116, 117. In an embodiment, the STI regions 116, 117 may have a depth 158 about at least twice the height 152 of the body 118. In an embodiment, the original depth of the STI regions 116, 117, as illustrated in FIG. 3, may be about 1500 angstroms. After formation of the fin 118, as illustrated in FIG. 4, the fin 118 may have a height 152 of about 500 angstroms and the STI regions 116, 117 may have a depth 158 of about 1000 angstroms. In another embodiment, the original depth of the STI regions 116, 117, as illustrated in FIG. 3, may be between about 1000 angstroms and about 3000 angstroms. In yet other embodiments, the original depth of the STI regions 116, 117 may be different. After formation of the fin 118, as illustrated in FIG. 4, the fin 118 may have a height 152 of about $\frac{1}{3}^{rd}$ or less of the original depth, and the STI regions 116, 117 may have a depth 158 of about ⅔rds or more of the original depth. In other embodiments, the size of the fin 118 height 152 expressed relative to the depth 158 of the STI regions 116, 117 may be different.

Figure 5:
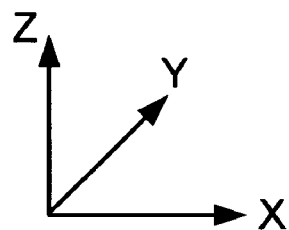
FIG. 5 is a perspective view that illustrates the fin after its formation.
Figure 5:
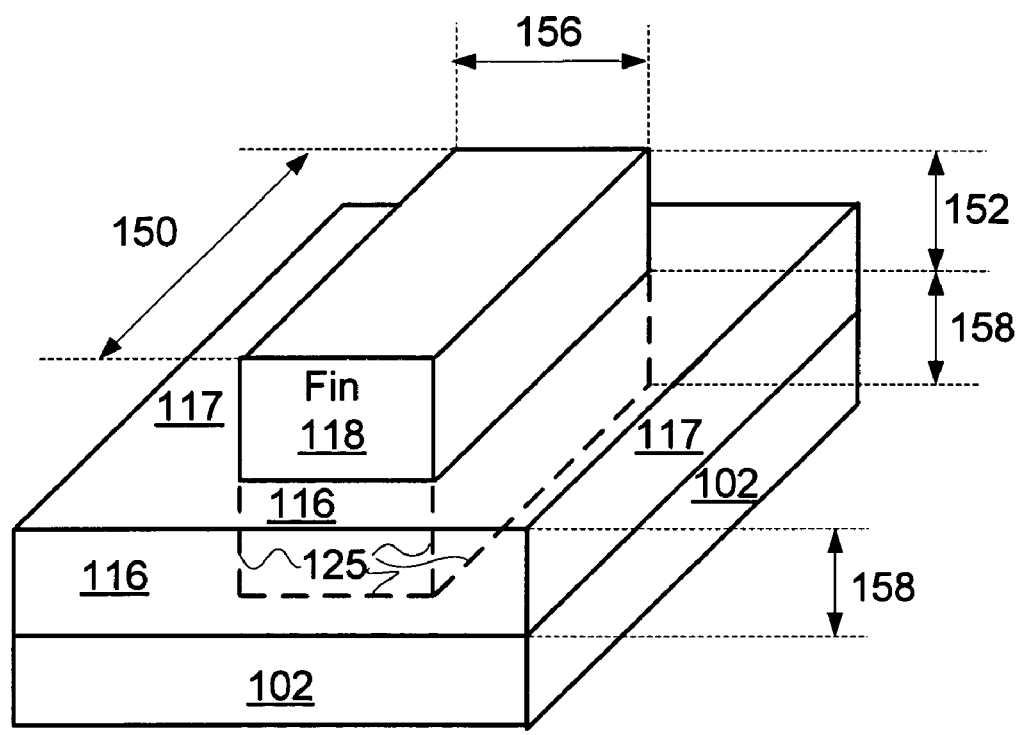

FIG. 5 is a perspective view that illustrates the fin 118 after its formation by removal of portions of the STI regions 116, 117 according to one embodiment. The front and back STI regions 116 and side STI regions 117 may surround the fin 118, which protrudes above the STI regions 116, 117. The body 118 may extend down through the STI regions 116, 117 to the rest of the substrate 102. Dashed lines 125 illustrate the boundary of the body 118 beneath the top surface of the STI regions 116, 117 as it extends to meet the other regions of the substrate 102. Also shown in FIG. 5 are the length 150 of the fin 118, the width 156 of the fin, the height 152 of the fin 118, and the depth 158 of the STI regions 116, 117. Note that the fin 118 may be slightly less long and less wide at the top than the point where it meets the STI regions 116, 117; the Figures show an idealized representation. In some embodiments, this tapering is avoided as much as is practicable, to keep the side walls straight.

Figure 6:
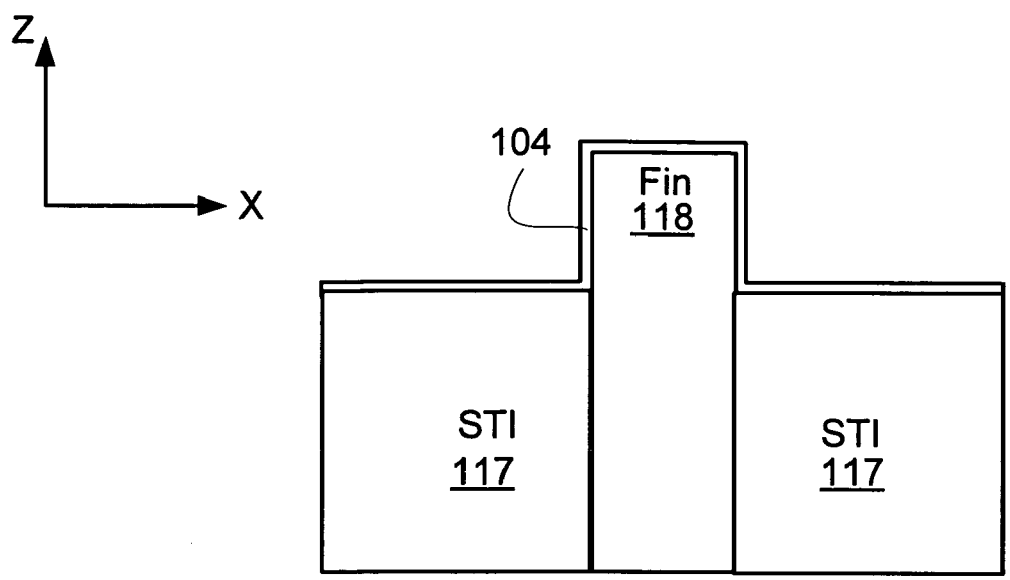
FIG. 6 is a cross sectional side view that illustrates a layer of gate dielectric material formed on the surfaces of the body and STI regions.

FIG. 6 is a cross sectional side view that illustrates a layer of gate dielectric 104 material formed on the surfaces of the body 118 and STI regions 116, 117, according to one embodiment. Gate dielectric layer 104 material may comprise any suitable type of dielectric material.

Figure 7:
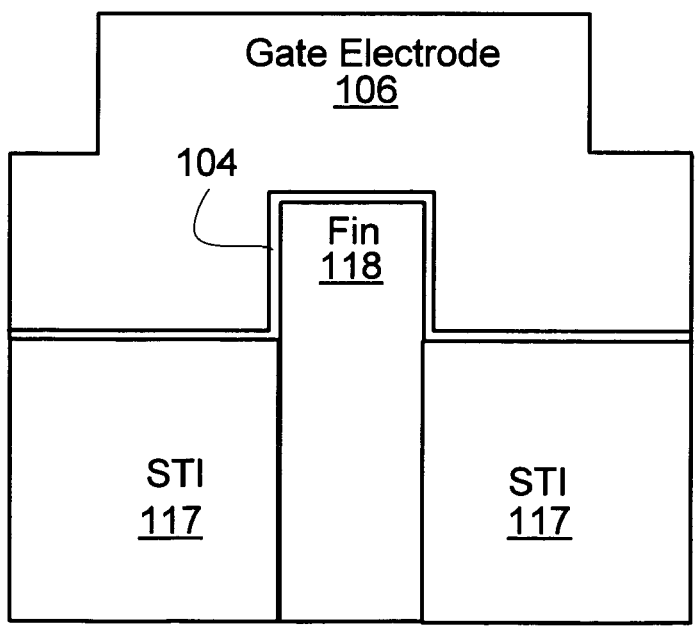
FIG. 7 is a cross sectional side view that illustrates a layer of material that will form the gate electrode deposited on the gate dielectric layer material.

FIG. 7 is a cross sectional side view that illustrates a layer of material that will form the gate electrode 106 deposited on the gate dielectric layer 104 material. In some embodiments, the layer of material that will form the gate electrode 106 may comprise a single layer of a single material. In other embodiment, multiple different materials may be used, and there may be multiple layers of material. Thus, in some embodiments, the gate electrode 106, while illustrated as a single layer, may comprise multiple layers of different materials, and while referred to here as a single layer of material, it may actually comprise multiple layers. The gate electrode 106 may be formed of any suitable gate electrode material. In an embodiment, the gate electrode 106 may comprise polysilicon, which may be doped. In another embodiment, the gate electrode 106 may comprise a layer of polysilicon on a layer of metal. In yet other embodiments, the gate electrode 106 may comprise different layers of materials, and may comprise more than two layers. The layer of material that will form the gate electrode 106 may have a thickness that is at least about twice as great as the height 152 of the body 118 in an embodiment, although it may have different thicknesses in other embodiments. The layer of material that will form the gate electrode 106 may be conformally deposited.

Figure 8:
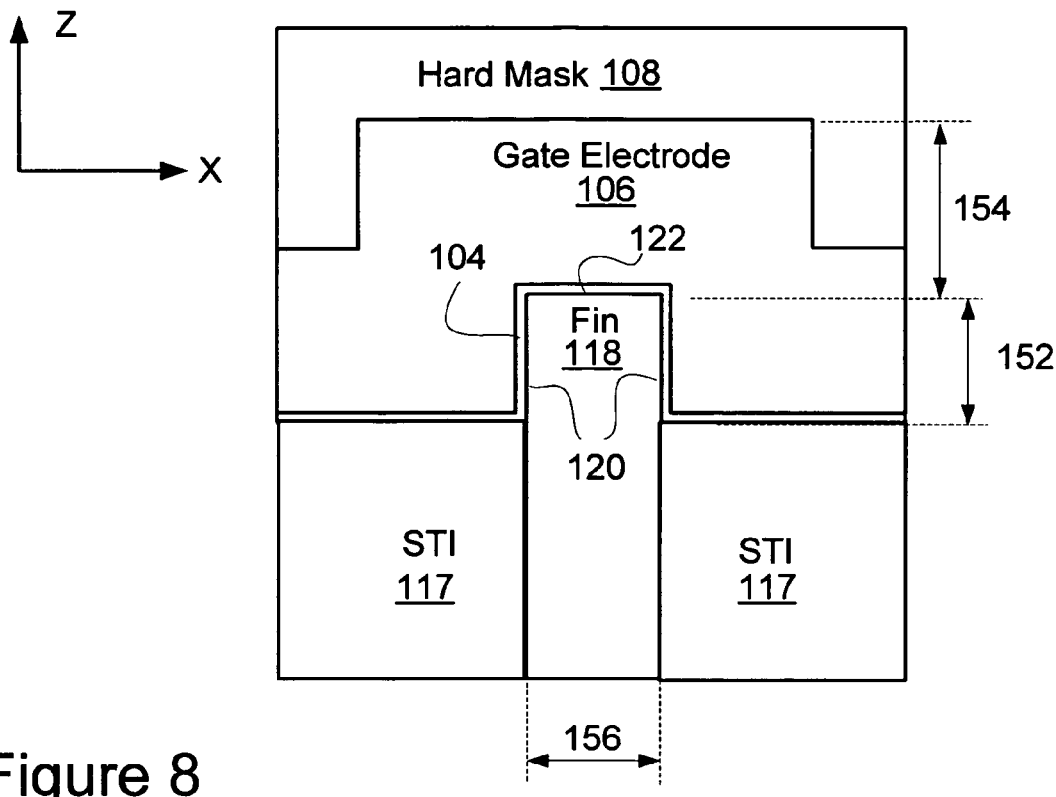
FIG. 8 is a cross sectional side view that illustrates a hard mask layer formed on the gate electrode material.

FIG. 8 is a cross sectional side view that illustrates a hard mask layer 108 formed on the gate electrode 106 material, according to one embodiment of the present invention. The hard mask 108 may be patterned so that it protects areas of the gate electrode 106 material and gate dielectric 104 material desired to be left in place while exposing areas desired to be removed. The exposed areas of gate electrode 106 material and gate dielectric 104 material may be removed by any suitable method.

Figure 9:
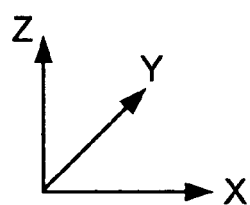
FIG. 9 is a perspective view that illustrates the device after patterning of the hard mask and removal of areas of the gate electrode material and gate dielectric material.
Figure 9:
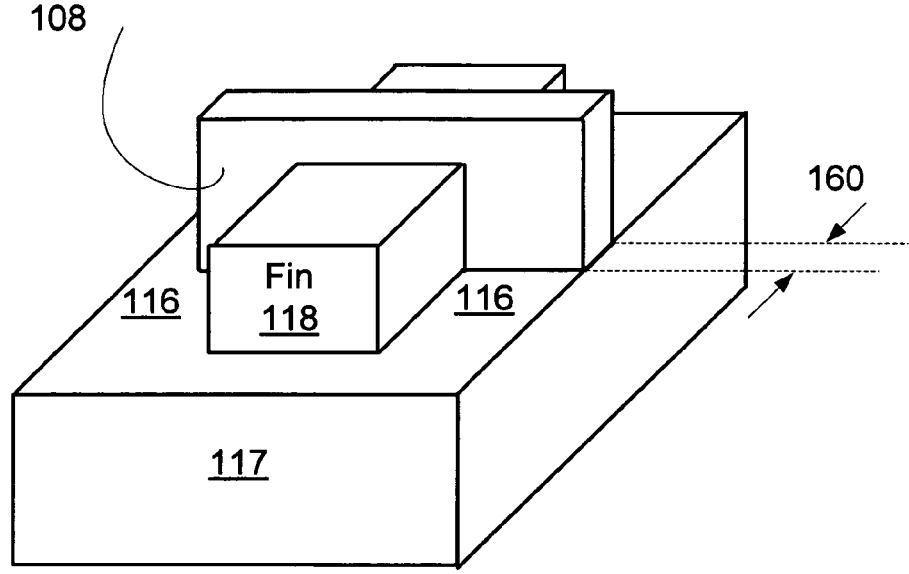

FIG. 9 is a perspective view that illustrates the device 100 after patterning of the hard mask 108 and removal of areas of the gate electrode 106 material and gate dielectric 104 material desired to be removed, according to one embodiment. The gate dielectric layer 104, gate electrode 106, and hard mask layer 108 can be seen adjacent to all three sides (top and side walls) of the body 118. Note that for simplicity, the gate dielectric layer 104, gate electrode 106, and hard mask layer 108 are not shown separately. Having gate electrode adjacent to all three sides allows the effective gate width of the device 100 to be the width 156 of the body 118 plus twice the height 152 of the body 118. Distance 160 is the gate length of the device 100. In an embodiment, the distance 160 may be between about 10 nanometers and about 50 nanometers. In other embodiments, the distance may be larger, such as up to 2 microns for example, or smaller.

Figure 10:
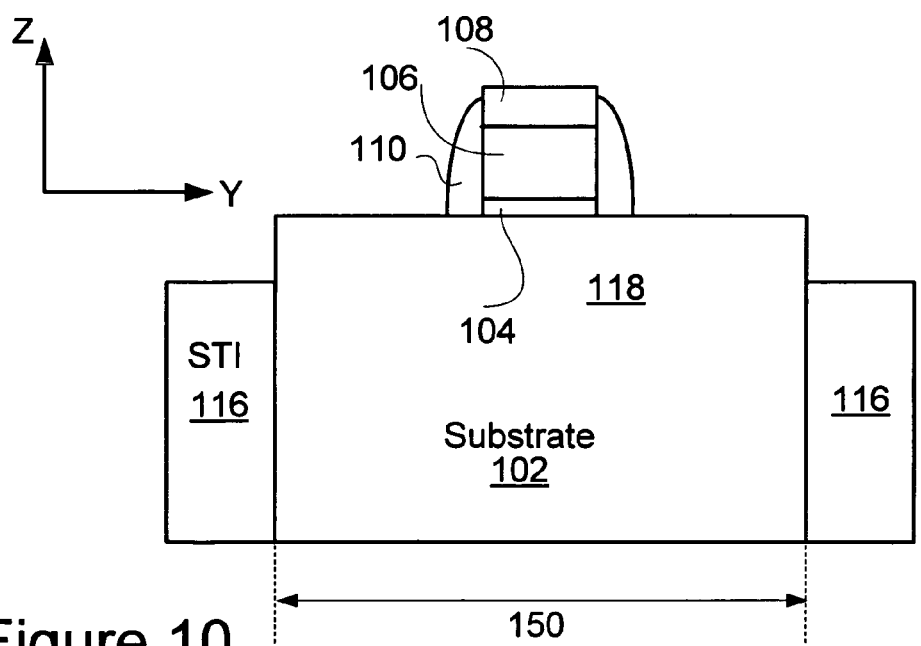
FIG. 10 is a cross sectional side view that illustrates the device after formation of the spacers.

FIG. 10 is a cross sectional side view that illustrates the device 100 after formation of the spacers 110, according to one embodiment of the present invention. Additional processes, such as formation of tip junctions may be performed prior to formation of spacers 110 in some embodiments. Formation of spacers 110 may be done by any suitable method. In an embodiment, a layer of spacer 110 material may be deposited on the device 100. This material may comprise any suitable material, such as silicon nitride, silicon dioxide or another material. Portions of the layer of spacer 110 material may then be removed, to leave spacers 110 adjacent the gate dielectric layer 104, gate electrode 106, and hard mask 108, but substantially remove portions of the layer of spacer 110 material adjacent to the locations where the body 118 meets the STI regions 116, 117, as well as other areas. As a result of this, the top of the spacers 110 may be below the top of the hard mask 108.

Figure 11:
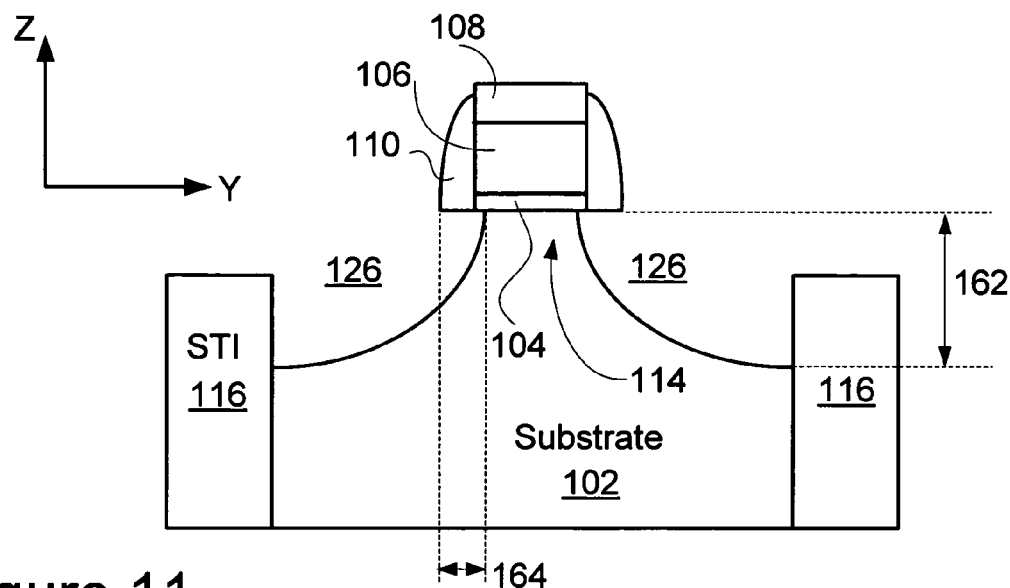
FIG. 11 is a cross sectional side view that illustrates the device after recesses have been formed in the body.

FIG. 11 is a cross sectional side view that illustrates the device 100 after recesses 126 have been formed in the body 118, according to one embodiment of the present invention. The recesses 126 may be referred to as source and drain recesses. The recesses 126 may be formed by any suitable method, such as a wet etch. The recesses 126 may have a depth 162 below the top surface of the body 118 adjacent the gate dielectric 104 between about 50 angstroms and about 1000 angstroms in some embodiments, although different depths 162 are possible in other embodiments. In an embodiment, the recesses 126 may extend laterally under the sidewalls 110 and possibly the gate dielectric 104 for a distance 164 of between 5 nanometers and about 50 nanometers, although in other embodiments this distance 164 may be different. In some embodiments where the substrate 102 is a non-SOI substrate, the recesses 126 may be made deeper than is possible with SOI substrates, because in the SOI substrates the depth of the buried oxide layer presents a maximum possible depth for the recesses 126. The deeper recesses 126 may allow greater stress to be placed on the channel regions 114, resulting in better performance than is possible with the lower stresses of SOI-based devices.

The process used to remove portions of the top surface of the fin 118 may also remove portions of the side walls of the fin 118, as the process used may be partially or fully isotropic in some embodiments. The results of such an removal process may be seen in FIG. 1c through 1e, discussed above, which show portions of the side walls of the fin 118 being removed at various distances from the gate electrode 106.

Figure 12:
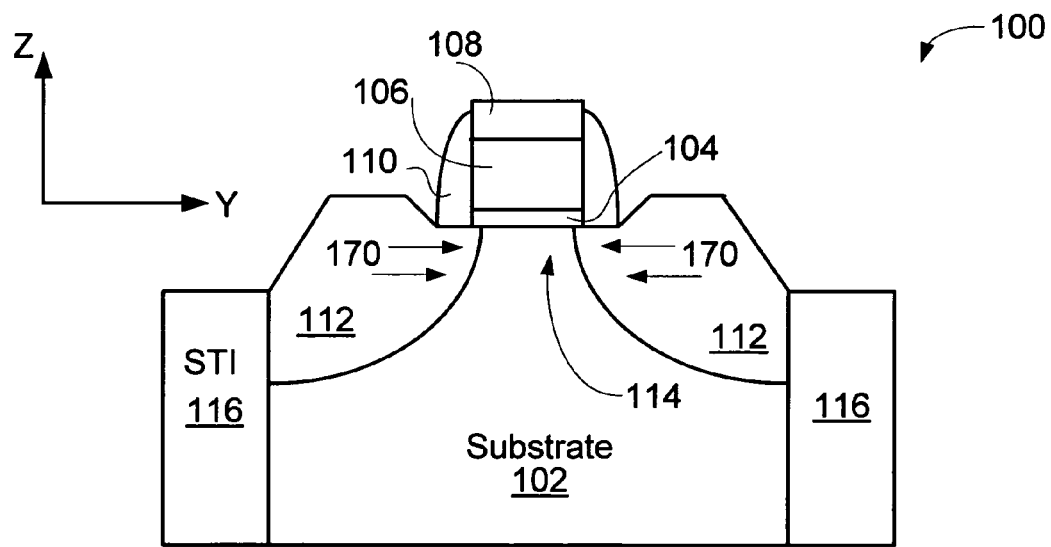
FIG. 12 is a cross sectional side view that illustrates the device after source and drain material has been formed in the recesses.

FIG. 12 is a cross sectional side view that illustrates the device 100 after source and drain material 112 has been formed in the recesses 126, according to one embodiment. The source and drain material 112 may act as source and drain for the device 100, or as part of the source and drain of the device 100. In an embodiment, the source and drain material 112 may comprise silicon germanium (SiGe), silicon carbide (SiC), nickel silicide (NiSi), titanium silicide (TiSi$_2$), cobalt silicide (CoSi$_2$), or another material.

In an embodiment, the substrate 102 comprises a material with a lattice structure (e.g., base centered cubic or another lattice structure) and a lattice spacing. The source and drain material 112 may comprise the same lattice structure as the material of the substrate 102, but have a different lattice spacing. The result of this different lattice spacing may be to cause a stress in the channel regions 114 of the device 100. If the source and drain material 112 has a lattice spacing larger than that of the substrate 112 material, it may cause a compressive stress 170 in the channel regions 114. If the source and drain material 112 has a lattice spacing smaller than that of the substrate 112 material, it may cause a tensile stress (not shown) in the channel regions 114. Thus, as the source and drain material 112 causes a stress in the channel 114 regions of the device 100, it may also be referred to as a stress material 112.

In one embodiment, the substrate 102 may comprise single crystal silicon and the source and drain material 112 in the recesses 126 may comprise silicon germanium, which has a larger lattice spacing than silicon. In this embodiment, the SiGe stress material may cause a compressive stress 170 in the channel regions 114, which may improve the performance of a PMOS device 100. In other embodiments, the stress material 112 may cause a tensile stress in the channel regions 114, which may improve the performance of an NMOS device 100. As recesses 126 may be formed in the sides of the fin 118 as well as the top surface of the fin 118, and stress material formed in the recesses 126 on both the sides and top of the fin 118, all three channel regions 114 may be stressed.

In an embodiment, the stress material 112 may be formed epitaxially, although other processes may also be used. Epitaxially-formed source and drain material 112 may extend past the volume that used to contain the fin 118, as illustrated in FIG. 12. In other embodiments, the stress material 112 may be substantially coplanar with the top surface of the fin 118.

In some embodiments, the source drain material 112 may be doped as it is formed. For example, in an embodiment where the stress material 112 comprises SiGe formed epitaxially, dopants may be incorporated into the SiGe as it is grown. In such an embodiment, no ion implantation or annealing steps may be required. In other embodiments, ions may be implanted into the source and drain material 112 after the source and drain material 112 has been formed in order to transform the source and drain material into a source and drain of the device 100.

Additional process steps may be performed to complete the device 100, as will be appreciated by those of skill in the art.

Figure 13:
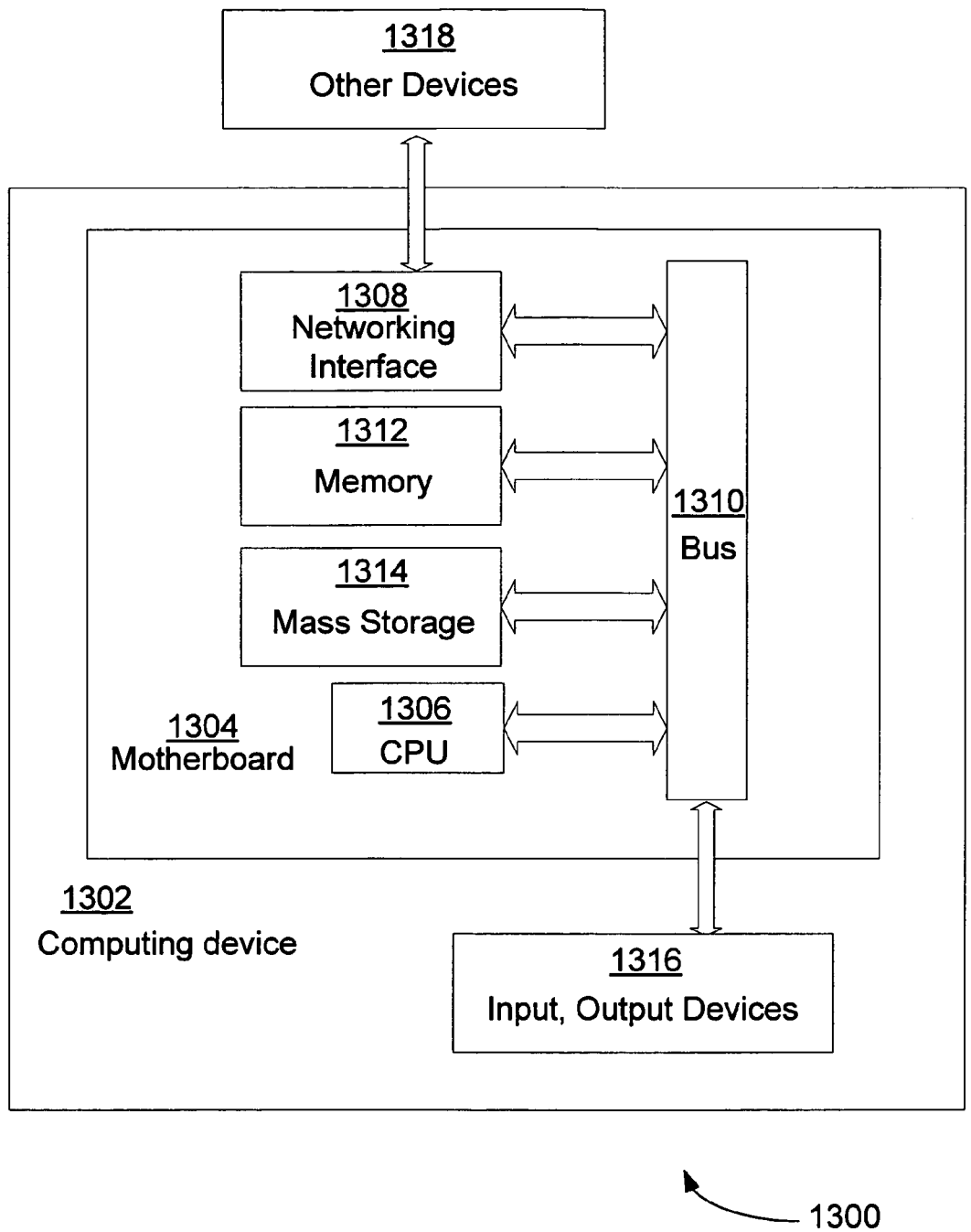
FIG. 13 is a block diagram that illustrates a system in accordance with one embodiment of the present invention.

FIG. 13 is a block diagram that illustrates a system 1300 in accordance with one embodiment of the present invention. One or more multi-gate devices 100 with stress material 112 causing stress in the channel regions 114 as described above may be included in the system 1300 of FIG. 13. As illustrated, for the embodiment, system 1300 includes a computing device 1302 for processing data. Computing device 1302 may include a motherboard 1304. Coupled to or part of the motherboard 1304 may be in particular a processor 1306, and a networking interface 1308 coupled to a bus 1310. A chipset may form part or all of the bus 1310. The processor 1306, chipset, and/or other parts of the system 1306 may include one or more devices 100 as described above.

Depending on the applications, system 1300 may include other components, including but not limited to volatile and non-volatile memory 1312, a graphics processor (integrated with the motherboard 404 or connected to the motherboard as a separate removable component such as an AGP or PCI-E graphics processor), a digital signal processor, a crypto processor, mass storage 1314 (such as hard disk, compact disk (CD), digital versatile disk (DVD) and so forth), input and/or output devices 1316, and so forth.

In various embodiments, system 1300 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

Any of one or more of the components 1306, 1314, etc. in FIG. 13 may include one or more device 100 as described herein. For example, a tri-gate transistor 100 with SiGe stress material 112 may be part of the CPU 1306, motherboard 1304, graphics processor, digital signal processor, or other devices.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A semiconductor device, comprising:
   a substrate comprising a bulk semiconductor material, the bulk semiconductor material having a first crystal lattice with a first lattice structure and a first lattice spacing;

an insulating layer on the bulk semiconductor material;

a body region extending from the bulk semiconductor material through the insulating layer, the body region having a top surface and two side walls exposed above the insulating layer, the two side walls being separated by a width and extending for a length;

a gate electrode adjacent to at least a portion of the top surface and adjacent to at least a portion of each of the two side walls of the body region, there by forming three gates;

a source recess and a drain recess formed in the top surface and formed in both side walls of the body region on either side of the gate electrode; and a stress material in the source and drain recesses, the stress material comprising a second material with a second crystal lattice with a second lattice structure substantially the same as the first lattice structure and a second lattice spacing different than the first lattice spacing.

2. The device of claim 1, further comprising channel regions in the substrate between the source and the drain under the gate electrode and adjacent the top surface and side walls of the body region.

3. The device of claim 1, further comprising:

front and back shallow trench isolation regions, with the length of the body region being between the front and back shallow trench isolation regions;

side shallow trench isolation regions in the substrate on either side of the side walls of the body region; and wherein the shallow trench isolation regions have a depth.

4. The device of claim 3, wherein the top surface of the body region, under the gate electrode, is a height above the side shallow trench isolation regions.

5. The device of claim 4, wherein the height of the body region is at least about twice the width of the body region.

6. The device of claim 4, wherein the depth of the shallow trench isolation regions is at least about twice the height of the body region.

7. The device of claim 6, wherein the height of the body region is at least about twice the width of the body region.

8. The device of claim 1, wherein the source and the drain comprise the second material and the second material extends vertically beyond the top surface and horizontally beyond the side walls of the body region at the source and at the drain.

9. The device of claim 8, wherein the second lattice spacing is larger than the first lattice spacing.

10. The device of claim 8, wherein the second lattice spacing is smaller than the first lattice spacing.

11. A semiconductor device, comprising:

a substrate comprising a bulk semiconductor material with a first lattice with a first lattice structure and a first lattice spacing;

front, back, and side shallow trench isolation regions in the substrate, the shallow trench isolation regions having a depth;

a body region of the substrate, at least a portion of the body region extending a height above the shallow trench isolation regions, the body region having a length between the front and back shallow trench isolation regions and a width between the side shallow trench isolation regions;

a gate electrode on a top surface and on two side walls of the body region, thereby forming three gates;

channel regions in the body region under the gate electrode;

source/drain recesses on either side of the gate electrode, the source/drain recesses including recesses in the top surface and in each of the side walls of the body region; and a second material in the source/drain recesses with a second lattice structure substantially the same as the first lattice structure and a second lattice spacing different than the first lattice spacing.

12. The device of claim 11, wherein the width is between about 20 nanometers and about 40 nanometers and the height is between about 1.8 times the width and about 2.2 times the width.

13. The device of claim 12, wherein the height of the body region is between about 400 angstroms and about 600 angstroms and the depth of the shallow trench isolation regions is between about 900 and about 1100 angstroms.

14. The device of claim 13, wherein the second material in the source/drain recesses extends beyond the top surface and the side walls of the body region at the source and at the drain.

\* \* \* \* \*